US008660596B2

(12) United States Patent
Yang et al.

(10) Patent No.: US 8,660,596 B2
(45) Date of Patent: Feb. 25, 2014

(54) ELECTRONIC APPARATUS AND ASSOCIATED FREQUENCY ADJUSTING METHOD

(75) Inventors: Ming-Jie Yang, Tainan County (TW); Chu-Wei Lo, Taipei County (TW)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 707 days.

(21) Appl. No.: 12/895,877

(22) Filed: Oct. 1, 2010

(65) Prior Publication Data

US 2012/0083304 A1   Apr. 5, 2012

(51) Int. Cl.
*H04J 3/06*   (2006.01)

(52) U.S. Cl.
USPC .......... 455/501; 455/502; 370/350; 370/347; 370/321; 370/324; 370/503; 370/395.62

(58) Field of Classification Search
USPC .......... 455/501, 502; 370/350, 347, 321, 324, 370/503, 395.62
See application file for complete search history.

(56) References Cited

U.S. PATENT DOCUMENTS

| 7,773,962 | B2* | 8/2010 | Sutskover et al. | 455/130 |
| 8,218,521 | B2* | 7/2012 | Koyanagi | 370/344 |
| 8,264,292 | B2* | 9/2012 | Ruffieux | 331/158 |
| 8,457,103 | B2* | 6/2013 | Neumann et al. | 370/350 |
| 2006/0202771 | A1* | 9/2006 | Seki et al. | 331/158 |
| 2008/0085693 | A1 | 4/2008 | Harms | |
| 2008/0100281 | A1* | 5/2008 | Peng | 324/76.41 |
| 2010/0081405 | A1 | 4/2010 | Perry | |
| 2010/0222001 | A1 | 9/2010 | Sangary | |
| 2011/0012686 | A1* | 1/2011 | Ruffieux | 331/116 R |
| 2011/0075778 | A1* | 3/2011 | Chang et al. | 375/354 |
| 2011/0076945 | A1* | 3/2011 | Chang et al. | 455/41.2 |
| 2011/0254632 | A1* | 10/2011 | Sawada | 331/10 |
| 2011/0274221 | A1* | 11/2011 | Yang et al. | 375/344 |
| 2013/0244720 | A1* | 9/2013 | Hsia et al. | 455/552.1 |

FOREIGN PATENT DOCUMENTS

CN   101501992 A   8/2009

* cited by examiner

*Primary Examiner* — Bobbak Safaipour
(74) *Attorney, Agent, or Firm* — Winston Hsu; Scott Margo

(57) ABSTRACT

An electronic apparatus includes a processing unit. The processing unit, when detecting a frequency offset between an radio frequency (RF) module and a corresponding base station (BS), controls an oscillator to change a frequency of a first reference clock signal outputted therefrom by a first frequency variation, and controls a compensation unit to change a frequency of a second reference clock signal outputted therefrom by a second frequency variation. Wherein the compensation unit receives and adjusts the first reference clock signal from the oscillator to output the second reference clock signal, and the frequency offset substantially equals the first frequency variation plus the second frequency variation.

19 Claims, 8 Drawing Sheets

ELECTRONIC APPARATUS AND ASSOCIATED FREQUENCY ADJUSTING METHOD

BACKGROUND OF THE INVENTION

1. Field of the Invention

The present invention relates to an electronic apparatus having a plurality of wireless communications blocks, and more particularly, to an electronic apparatus equipped with an oscillator as a clock source shared by each of the wireless communications blocks, for providing a reference clock signal to the wireless communications blocks.

2. Description of the Related Art

Generally, in a wireless communications module, a radio frequency (RF) module receives signals from a remote base station (BS) via the air interface, and the received signals will be demodulated. However, when a frequency offset between the RF module and a corresponding BS is too large, accuracy of the data demodulation may be corrupted. For ensuring demodulation quality of the wireless communications module, it is essential to eliminate the frequency offset (i.e. carrier frequency offset) between the RF module and the corresponding BS. Please refer to FIG. 1. FIG. 1 is a diagram illustrating frequency adjustment of a wireless communications module. In the receiving process, a mixer disposed in the RF module multiplies a high frequency clock signal (e.g. a Local Oscillator (LO) signal) with the received RF signals. The high frequency clock signal may be generated and outputted from an RF frequency synthesizer with reference to a reference clock signal. The frequency of the high frequency clock signal coupled to the mixer should be identical to a frequency of a BS carrier for accurate demodulation, and a wireless communications block operates to remove the carrier frequency offset between the RF module and the BS when the carrier frequency offset is obtained. In FIG. 1, a wireless communications block controls a baseband (BB) module to adjust a frequency of a clock signal (which is outputted from a reference oscillator) by using an Automatic Frequency Control (AFC) unit when a frequency offset is obtained by the BB module at t1. Supposing that a frequency offset between the RF module and the corresponding BS is estimated as β by the baseband module (FIG. 1), the frequency offset may be removed by using the AFC unit to control the oscillator to change its output frequency (i.e. the frequency of the output clock signal) by a frequency variation β. By adjusting the frequency of the clock signal outputted from the oscillator by the frequency variation β, the frequency of the high frequency clock signal (also called "the RF carrier") becomes the same as the frequency of the BS carrier. Taking a Global System for Mobile Communications/General Packet Radio Service/Enhanced General Packet Radio Service (GSM/GPRS/EGPRS) block as an example, once the frequency offset between the RF module and the BS is removed, the output frequency of the adjusted oscillator is exactly at 26 Mhz.

With the development of electronic technologies, a modern electronic apparatus, such as a mobile electronic device, may be equipped with more than one wireless communications service, such as GSM/GPRS/EGPRS (GGE), Bluetooth, Wireless Fidelity (WiFi), Worldwide Interoperability for Microwave Access (WiMAX) wireless communications service, and so on. A modern mobile electronic device may contain many wireless communications blocks to provide communications services corresponding to different wireless communications standards, respectively. In addition, for reducing the product cost, all the wireless communications blocks of the mobile electronic device may share a single reference oscillator, since the cost of a precise oscillator (e.g. a crystal oscillator) is very high. When one wireless communications block (e.g. a GGE module) removes its carrier frequency offset between the RF module and the corresponding BS without consideration for other wireless communications blocks in the electronic apparatus, performance of the other wireless communications blocks within the electronic apparatus may be degraded due to the dramatic frequency jump of the reference clock signal outputted by the shared oscillator.

BRIEF SUMMARY OF THE INVENTION

Electronic apparatuses and frequency adjusting methods executed by the electronic apparatuses are provided. According to an exemplary embodiment of the present invention, an electronic apparatus comprising a processing unit is provided. The processing unit, when detecting a frequency offset between an radio frequency (RF) module and a corresponding base station (BS), controls an oscillator to change a frequency of a first reference clock signal outputted therefrom by a first frequency variation, and controls a compensation unit to change a frequency of a second reference clock signal outputted therefrom by a second frequency variation, wherein the compensation unit receives and adjusts the first reference clock signal from the oscillator to output the second reference clock signal, and the frequency offset substantially equals the first frequency variation plus the second frequency variation.

According to another exemplary embodiment of the present invention, a frequency adjusting method is provided. The frequency adjusting method comprises the following step: when detecting a frequency offset between an radio frequency (RF) module and a corresponding base station (BS), controlling, by a processing unit, an oscillator to change a frequency of a first reference clock signal outputted therefrom by a first frequency variation, and controlling, by the processing unit, a compensation unit to change a frequency of a second reference clock signal outputted therefrom by a second frequency variation, wherein the compensation unit receives and adjusts the first reference clock signal from the oscillator to output the second reference clock signal, and the frequency offset substantially equals the first frequency variation plus the second frequency variation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . " Also, the term "couple" is intended to mean either an indirect or direct electrical connection. Accordingly, if one device is coupled to another device, that connection may be through a direct electrical connection, or through an indirect electrical connection via other devices and connections.

Figure 1:
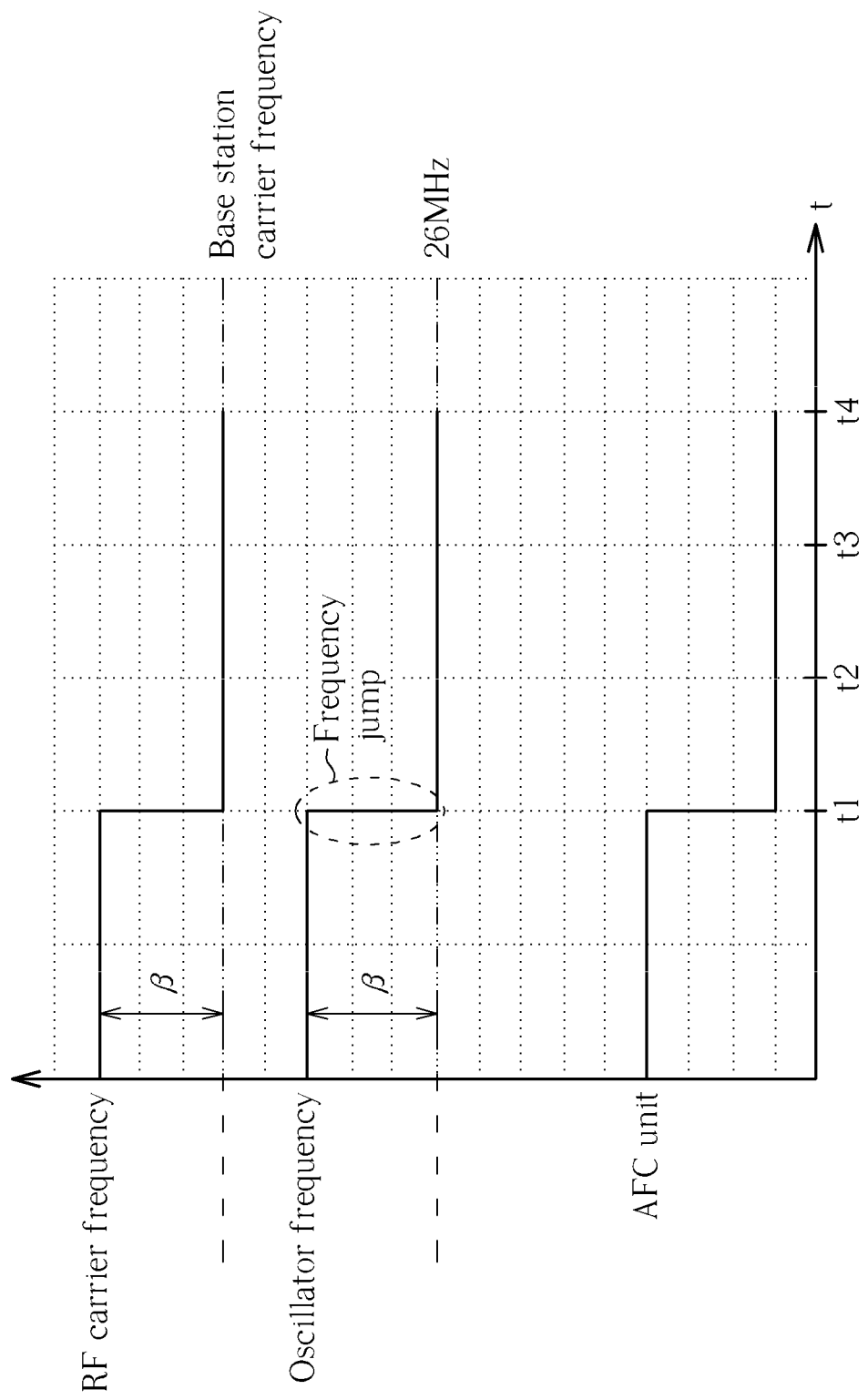
FIG. 1 is a diagram illustrating frequency adjustments of a wireless communication module.
Figure 2:
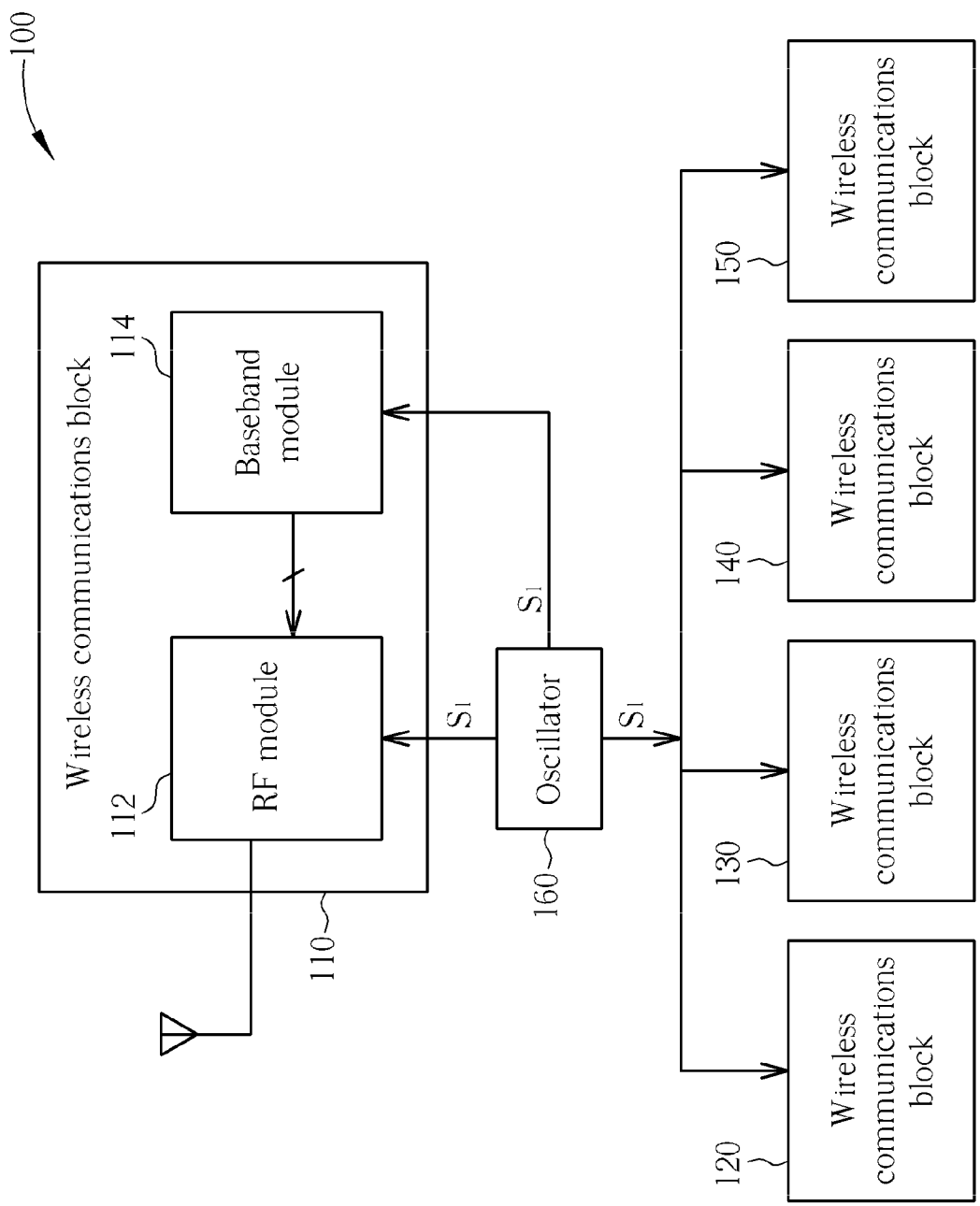
FIG. 2 is a diagram illustrating an electronic apparatus having a plurality of wireless communications blocks according to an embodiment of the present invention.

Please refer to FIG. 2. FIG. 2 is a diagram illustrating an electronic apparatus 100 having a plurality of wireless communications blocks 110-150 according to an embodiment of the present invention. The electronic apparatus 100 is a mobile electronic device which may be installed in a notebook, a cellular phone, a portable gaming device, a portable multimedia player, a receiver, or other such product. The electronic apparatus 100 includes the plurality of wireless communications blocks 110 to 150 to provide different wireless communications services, respectively. The wireless communications blocks 110 to 150 may communicate with corresponding apparatuses (e.g. base stations, access points, Bluetooth devices, and so on) using different protocols via the air interface. The wireless communications block 110, for example, includes an RF module 112 and a baseband module 114. The RF module 112 receives wireless RF signals via the air interface, and converts the received RF signals into baseband signals. The baseband signals are then processed by the baseband module 114. The RF module 112 may contain hardware devices to perform radio frequency conversion. In an exemplary embodiment, the RF module 112 may contain a mixer (not shown in FIG. 2) to multiply the RF signals with a clock signal (e.g. an RF carrier) having an RF carrier frequency for signal receiving, wherein the radio frequency may be, for example, 936 MHz for a GSM receiver module, or others, according to design requirements. When the RF module 112 receives the wireless radio frequency (RF) signals from a broadcast node, the mixer recovers the received signal as baseband signals by using the high frequency clock signal (e.g. the RF carrier), and the baseband module 114 converts the baseband signals to a plurality of digital signals and processes the digital signals. In addition, the baseband module 114 may contain hardware devices to perform baseband signal processing. In an exemplary embodiment, the baseband signal processing may contain analog to digital conversion (ADC)/digital to analog conversion (DAC), gain adjustment, modulation/demodulation, encoding/decoding, and so on.

Moreover, the baseband module 114 may include a processing unit (not shown in FIG. 2). The processing unit may be a general-purpose processor or a microcontroller unit (MCU), which loads and executes program code or instructions with data in an abstract data type to complete specific functions. The processing unit, for example, may be used to estimate a frequency offset (e.g. a carrier frequency offset) between the RF module 112 and a corresponding BS. If the processing unit disposed in the baseband module 114 obtains the carrier frequency offset in a receiving process, the processing unit will control certain elements of the wireless communications block 110 to eliminate the frequency offset to guarantee the demodulation quality of the wireless communications block 110 while considering other wireless communications blocks 120-150 to ensure their performance quality. For example, if the processing unit obtains an estimated frequency offset between the RF module 112 and a corresponding BS, to avoid the mentioned frequency jump, the processing unit may control elements within the wireless communications block 110 to trace the frequency of the high frequency clock signal (e.g. an LO signal) to the frequency of broadcasted signals by the base station by adjusting the frequency of the reference clock signal $S_1$ outputted from the oscillator gradually, wherein the frequency tracing operation adjusts the frequency of the high frequency clock signal to be identical to a frequency of the BS carrier. In this way, the demodulation quality of the wireless communications block 110 and the performance of the wireless communications blocks 120-150 are both ensured. In an embodiment, the processing unit may control operations of the RF module 112 via a Baseband Serial Interface (BSI).

The wireless communications block 110, for example, may adhere to the Global System for the Mobile Communications (GSM) standard, the General Packet Radio Service (GPRS) standard, and/or the Enhanced General Packet Radio Service (EDGE) standard. However, according to different design requirements, the wireless communications block 110 may be a wireless communications block applying Code Division Multiple Access (CDMA) technology, such as: a wireless communications block of Multi-Frequency Time Division Multiple Access (MF-TDMA), Wideband Code Division Multiple Access (WCDMA), CDMA2000, Time Division Synchronous Code Division Multiple Access (TD-SCDMA), or others, according to design specifications. The wireless communications blocks 120, 130 or 140, and 150, for example, may be a Global Positioning System (GPS) module, a WiFi module, a Bluetooth module, and an FM module, respectively. Since the circuit details of the wireless communications block are not critical features of the present invention and are well known by people skilled in this art, further description therefore is omitted for the sake of brevity. Please note that number of the wireless communications blocks in FIG. 2 is for illustrative purposes only and is not meant to be a limitation of the present invention; in addition, the types of the wireless communications blocks 120-150 may vary according to design requirements, and all alternative designs following the spirit of the present invention fall within the scope of the present invention.

The oscillator 160 provides a reference clock signal $S_1$ to the baseband module 114 as a main clock of the baseband module 114 for operations thereof, and the main clock is also called a "system clock". That is, in addition to the baseband module 114, the oscillator 160 also provides the reference clock signal $S_1$ as a main clock of each of the wireless communications blocks 120-150. For the RF module 112, the oscillator 160 may be coupled to a frequency synthesizer (which may include a Phase Lock Loop (PLL) circuit) disposed in the RF module 112. The PLL disposed in the frequency synthesizer generates a frequency that is a multiple of the input frequency. The frequency synthesizer disposed in the RF module 112 is coupled to a mixer (not shown in FIG. 2), and is used to provide a high frequency clock signal (e.g. the RF carrier/the LO signal). The high frequency clock signal having an RF carrier frequency is multiplied with the received RF signals. The precise oscillator 160 may be a crystal oscillator, such as a Voltage-Controlled Crystal Oscillator (VCXO), a Voltage Controlled Temperature Compensated Crystal Oscillator (VCTXO), a Digitally Controlled Crystal Oscillator (DCXO), or others, according to design requirements. Taking the VCXO as an example, the output frequency of the VCXO may vary by only a few tens of parts per million (ppm), because the high Q factor of the crystal oscillator allows pulling over only a small range of frequencies, thereby maintaining the precision of the reference clock signal. Since the details of TDMA technology and CDMA technology that the wireless communications block 110 may adhere to, and the various types of the crystal oscillators, are well-known by people skilled in this art, further description is omitted for the sake of briefness. Moreover, in some exemplary embodiments of the present invention, all the elements, including the wireless communications blocks 110-150 and the oscillator 160 are integrated into a single chip (System on a Chip, SOC) to further shrink production costs.

Details of the frequency adjusting method executed by the electronic apparatus and the related operations of the electronic apparatus to make the frequency change of the reference clock signal outputted by the shared oscillator gradually while tracing the frequency of broadcasted signals by the base station corresponding to the wireless communications block 210 are disclosed in the following paragraphs.

Figure 3:
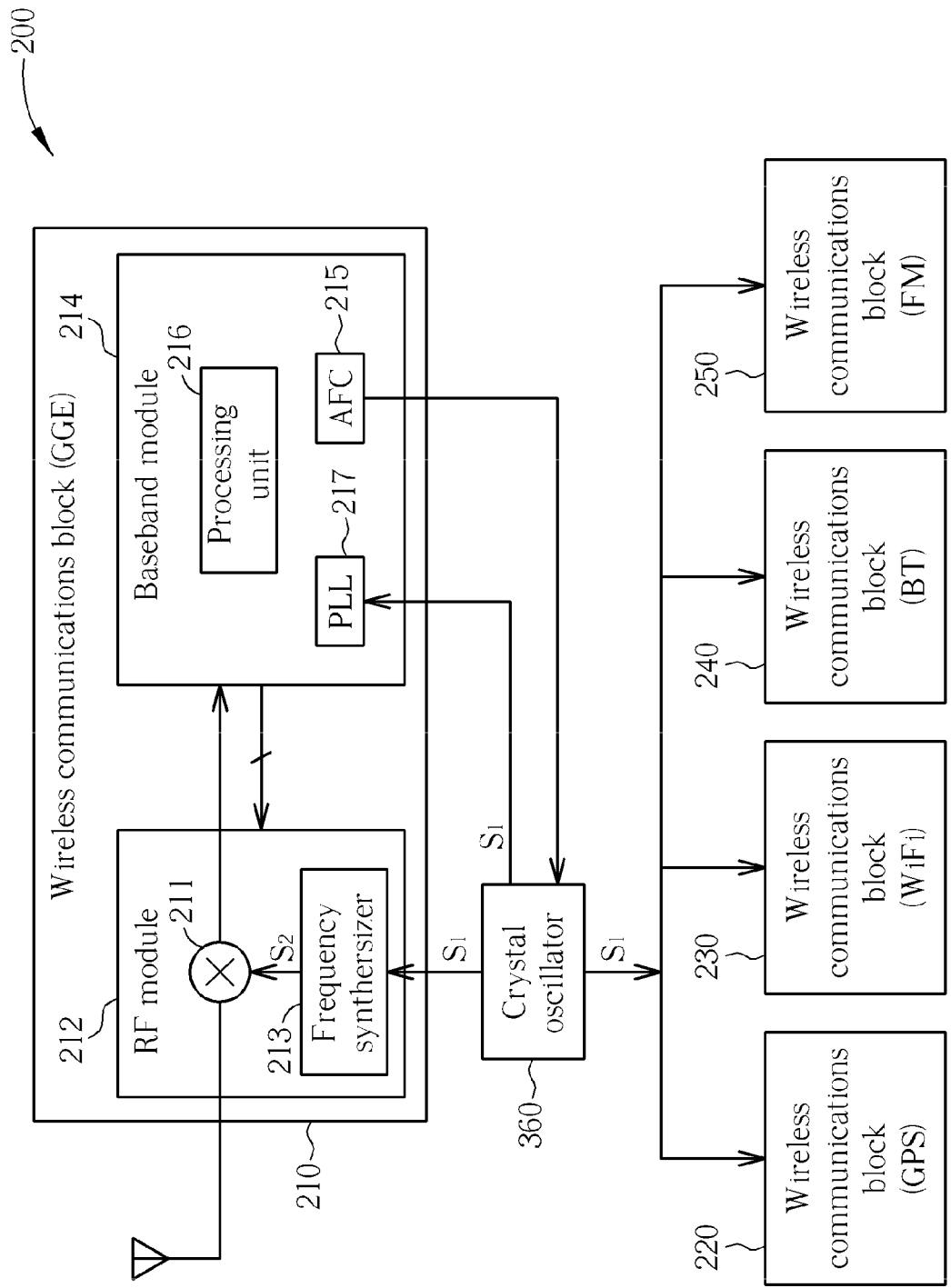
FIG. 3 is a diagram illustrating operational details of the electronic apparatus in FIG. 2 according to a first exemplary embodiment of the present invention.

Please refer to FIG. 3 in conjunction with FIG. 2. FIG. 3 is a diagram illustrating operational details of the electronic apparatus 100 in FIG. 2 according to a first exemplary embodiment of the present invention. A crystal oscillator 260 is shared by a plurality of wireless communications blocks 210, 220, 230, 240, and 250 for providing a reference clock signal $S_1$ as a reference clock. An RF module 212 receives the reference clock signal $S_1$ to generate a high frequency clock signal (e.g. the Local Oscillating (LO) signal) $S_2$ having the RF carrier frequency. The mixer 211 multiplies the received RF signals with the high frequency clock signal $S_2$ having the RF carrier frequency. The radio frequency may be, for example, 936 MHz for a GSM receiver module, or others, according to design requirements. When the RF module 212 receives the wireless radio frequency (RF) signals from a broadcast node, the mixer 211 recovers the received signal as baseband signals by using the high frequency clock signal (e.g. the RF carrier) $S_2$, and the baseband module 214 converts the baseband signals to a plurality of digital signals and processes the digital signals.

In this embodiment, the wireless communications block 210 may be a GSM/GPRS/EGPRS (GGE) module complying with GGE standards, the wireless communications block 220 may be a GPS module complying with a GPS standard, the wireless communications block 230 may be a WiFi module complying with a WiFi standard, the wireless communications block 240 may be an FM module complying with an FM standard, and the wireless communications block 250 may be a Bluetooth module complying with a Bluetooth standard. However, the wireless communications block 210 may be a wireless communications block corresponding to CDMA technology in other exemplary embodiments of the present invention. Types of the wireless communications blocks 220-250 are not meant to be a limitation of the present invention, and all alternative designs fall within the scope of the present invention.

For guaranteeing the demodulation quality of the wireless communications block 210 (e.g. the GGE module) while taking into consideration frequency tolerance of frequency variations per step for each of the wireless communications blocks 220-250, a baseband module 214 within the wireless communications block 210 ensures the precision of RF carries of the wireless communications block 210 by removing the frequency offset of the high frequency clock signal $S_2$, and controls the AFC unit 215 to adjust the output frequency of the reference clock signal $S_1$ gradually.

As mentioned above, if the wireless communications block 210 (e.g. the GGE block) executes the frequency tracking operation for making the frequency of the high frequency clock signal (e.g. the RF carrier) $S_2$ identical to that of a BS carrier by changing the frequency of the reference clock signal $S_1$ with the estimated frequency offset without considering each of maximum acceptable frequency variations per step for the wireless communications blocks 220-250, the resulting un-tolerable frequency variation (the frequency jump) of the oscillator 260 may degrade the performance of the wireless communications blocks 220-250 of the electronic apparatus 200. As the electronic apparatus having an oscillator shared by a plurality of the wireless communications blocks, a frequency adjusting method in the present invention can keep the frequency precision of the RF carrier (e.g. the high frequency clock signal $S_2$) in a receiving process and changes the frequency outputted from the oscillator gradually.

Figure 4A:
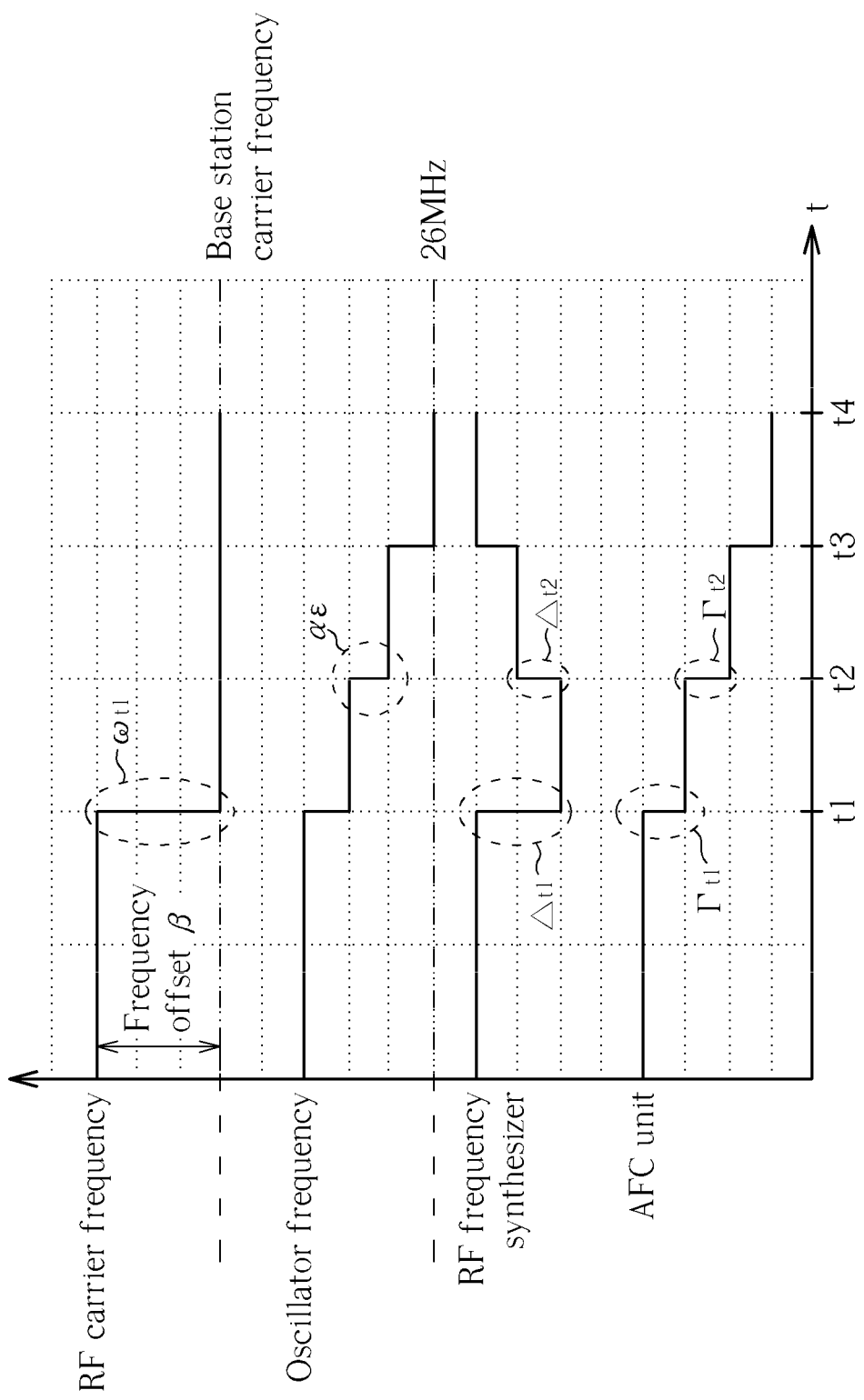
FIG. 4A is a first exemplary frequency adjusting case of the present invention executed by the electronic apparatus in FIG. 2.

In FIG. 4A, suppose that the minimum of maximum acceptable frequency variations for the wireless communications blocks 220-250 is α Hz/sec, and the time unit for controlling the AFC unit 215 and the frequency synthesizer 213 is ε seconds (which may be around 4-5 micro seconds). For example, when the wireless communications block 210 is a GSM module, the time unit ε is set to 4.615 ms, equal to a duration of a frame. The AFC unit 215 and the frequency synthesizer 213 are stepwise controlled. Suppose that adjusting the AFC unit 215 by one magnitude increases or decreases γ Hz for the reference clock signal $S_1$, and adjusting the frequency synthesizer 213 by one magnitude increases or decreases δ Hz for the high frequency clock (e.g. the RF carrier) signal $S_2$. At a frame j, the total magnitudes for adjusting the frequency synthesizer 213 is set as $\Delta_j$ and the total magnitudes for adjusting the AFC unit 215 is set as $\Gamma_j$ (e.g. a specific AFC DAC value) by control of the wireless communications block 210, and, at the previous frame j−1, the total magnitudes for adjusting the frequency synthesizer 213 is set as $\Delta_{j-1}$, and the total magnitudes for adjusting the AFC unit 215 is set as $\Gamma_{j-1}$. A total frequency variation $\omega_j$ of the RF carrier frequency at the frame j is present as:

$$\omega_j = (\Gamma_j - \Gamma_{j-1})*\gamma + (\Delta_j - \Delta_{j-1})*\delta \quad (1).$$

When the wireless communications block 210 finds a carrier frequency offset is $\beta_j$ at the frame j, frequency adjustment of the RF carrier may be executed according to the following scenarios:

When $|\beta_j| \geq \alpha \times \epsilon$:
If $\beta_j > 0$, then
the AFC DAC value $\Gamma_j$ at frame j is:

$$\Gamma_j = \Gamma_{j-1} + (\alpha \times \epsilon)/\gamma \quad (2\text{-}1);$$

and the total count $\Delta_j$ for adjusting the frequency synthesizer 213 at the frame j is $$\Delta_j = \Delta_{j-1} + (\beta j - \alpha \times \epsilon)/\delta \quad (2\text{-}2);$$

If $\beta j<0$, then
the AFC DAC value $\Gamma_j$ at frame j is:

$$\Gamma_j=\Gamma_{j-1}-(\alpha\times\epsilon)/\gamma \quad (3\text{-}1);$$

and the total count $\Delta_j$ for adjusting the frequency synthesizer 213 at the frame j is $$\Delta_j=\Delta_{j-1}+(\beta j+\alpha\times\epsilon)/\delta \quad (3\text{-}2);$$

When $|\beta_j|<\alpha\times\epsilon$ and $\Delta_{j-1}\neq 0$,
If sign $(\Delta_{j-1})$=sign $(\delta)$, then
the AFC DAC value $\Gamma_j$ at frame j is:

$$\Gamma_j=\Gamma_{j-1}+(\alpha\times\epsilon)/\gamma \quad (4\text{-}1);$$

and the total count $\Delta_j$ for adjusting the frequency synthesizer 213 at the frame j is $$\Delta_j=\Delta_{j-1}+(\beta j-\alpha\times\epsilon)/\delta \quad (4\text{-}2);$$

If sign $(\Delta_{j-1})\neq$sign $(\delta)$, then
the AFC DAC value $\Gamma_j$ at frame j is:

$$\Gamma_j=\Gamma_{j-1}-(\alpha\times\epsilon)/\gamma \quad (5\text{-}1);$$

and the total count $\Delta_j$ for adjusting the frequency synthesizer 213 at the frame j is $$\Delta_j=\Delta_{j-1}+(\beta j+\alpha\times\epsilon)/\delta. \quad (5\text{-}2);$$

When $|\beta_j|<\alpha\times\epsilon$ and $\Delta_{j-1}=0$, then
the AFC DAC value $\Gamma_j$ at frame j is:

$$\Gamma_j=\Gamma_{j-1}+\beta_j/\gamma; \quad (6\text{-}1)$$

and the total count $\Delta_j$ for adjusting the frequency synthesizer 213 at the frame j is $$\Delta_j=\Delta_{j-1} \quad (6\text{-}2)$$

Please refer to FIG. 4A in conjunction with FIG. 2, FIG. 3 and formulas (1)-(6-2). FIG. 4A is a first exemplary frequency adjusting case of the present invention in which the frequency of the high frequency clock signal $S_2$ is adjusted by controlling the AFC unit and the frequency synthesizer of an electronic apparatus of the present invention by the processing unit 216, and adjustment is made with consideration given to the wireless communications blocks (e.g. 220-250). In FIG. 4A, at a first timing t1, the adjusting magnitudes for the frequency synthesizer 213 is denoted as $\Delta_{t1}$, while the adjusting magnitudes for the reference clock signal $S_1$ by the AFC DAC disposed in the AFC unit 215 is denoted as $\Gamma_{t1}$. That is, at the timing t1, the total frequency variation of the high frequency clock signal $S_2$ from the frequency synthesizer 213 is present as: $\omega_{t1}=\Delta_{t1}\times\delta+\Gamma_{t1}\times\gamma$, the estimated frequency offset (e.g. $\beta$ in FIG. 4A). At a timing t2, through the AFC unit 215 the processing unit 216 adjusts the frequency of the reference clock signal $S_1$ with a frequency variation $\Gamma_{t2}\times\gamma$, and thorough the frequency synthesizer 213 disposed in the RF module 212 the processing unit 216 adjusts the frequency of the high frequency clock signal $S_2$ with a frequency variation $\Delta_{t2}\times\delta$, wherein the frequency variation $\Delta_{t2}=\Gamma_{t2}\times\gamma/\delta$, and a magnitude of the frequency variation $\Gamma_{t2}$ is $\alpha\times\epsilon$. The frequency variation $\Delta_{t2}\times\delta$ of the high frequency clock signal adjusted by the frequency synthesizer 213 has the same magnitude but different polarity from the frequency variation $\Gamma_{t2}\times\gamma$ at the timing t2. In this way, the frequency of the oscillator 260 is gradually adjusted to a target frequency (e.g. 26 MHz) (FIG. 4A) when the frequency adjusting process is finished. In this way, the total frequency offset of the high frequency clock signal is removed after the time t1 by gradually adjusting to the crystal oscillator 360 with compensations via the frequency synthesizer 213, avoiding the mentioned frequency jump happened to the crystal oscillator 360.

Figure 4B:
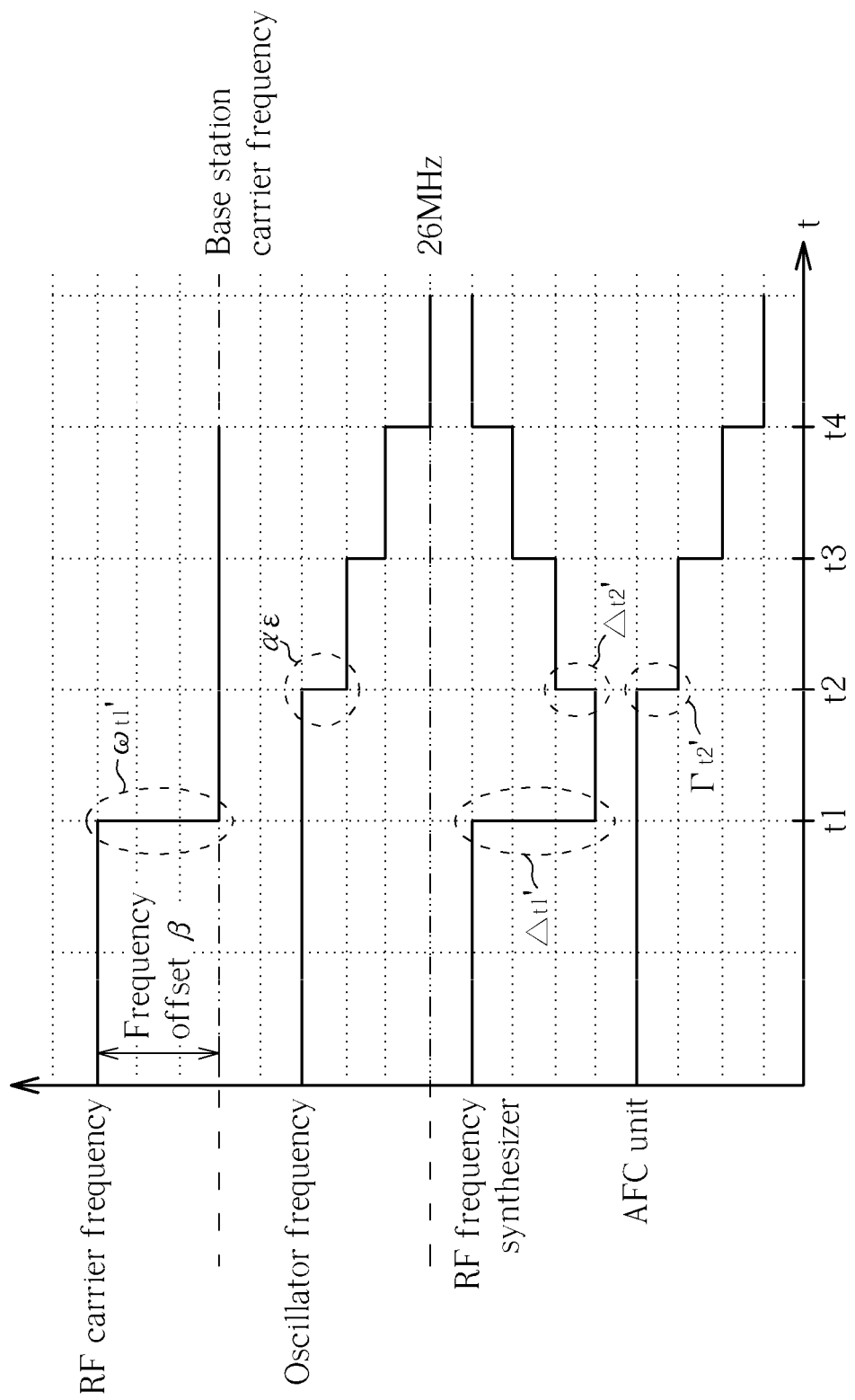
FIG. 4B is a second exemplary frequency adjusting case of the present invention executed by the electronic apparatus in FIG. 2.

Please refer to FIG. 4B in conjunction with FIG. 2, and FIG. 3. FIG. 4B is a diagram illustrating a second exemplary frequency adjusting case of the present invention in which the frequency of the high frequency clock signal $S_2$ is adjusted by controlling the AFC unit and the frequency synthesizer of an electronic apparatus of the present invention by the processing unit 216, and adjustment is made with consideration given to the wireless communications blocks (e.g. 220-250). In FIG. 4B, suppose that a frequency carrier offset between the RF module 212 and the corresponding BS station is estimated as $\beta$. Then, at a first timing t1, the wireless communications block 210 controls the frequency synthesizer 213 with a frequency variation $\Delta_{t1'}$, wherein the total frequency variation of the high frequency clock signal $S_2$ from the frequency synthesizer 213 is present as: $\omega_{t1'}=\Delta_{t1'}\times\delta$. In this way, the total frequency offset of the high frequency clock signal $S_2$ is removed at t1. At a timing t2, the processing unit 216 adjusts the frequency of the reference clock signal $S_1$ with a frequency variation $\Gamma_{t2'}\times\gamma$ via the AFC unit 215, wherein the frequency variation $\Gamma_{t2'}$ is equal to a frequency variation $\alpha\times\epsilon$ of the reference clock signal $S_1$, and adjusts the frequency of the high frequency clock signal $S_2$ with a frequency variation $\Delta_{t2'}=-\Gamma_{t2'}\times\gamma/\delta$ via the frequency synthesizer 213 disposed in the RF module 212. The frequency variation $\Delta_{t2'}\times\delta$ of the high frequency clock signal $S_2$ adjusted by the frequency synthesizer 213 has the same magnitude but different polarity than the frequency variation $\Gamma_{t2'}\times\gamma$ at the timing t2. In this way, the frequency of the oscillator 260 is gradually adjusted to a target frequency (e.g. 26 MHz) when the frequency adjusting process is finished. In this way, the total frequency offset of the high frequency clock signal is removed after the time t1 by gradually adjusting to the crystal oscillator 360 with compensations via the frequency synthesizer 213, avoiding the mentioned frequency jump happened to the crystal oscillator 360.

Figure 5:
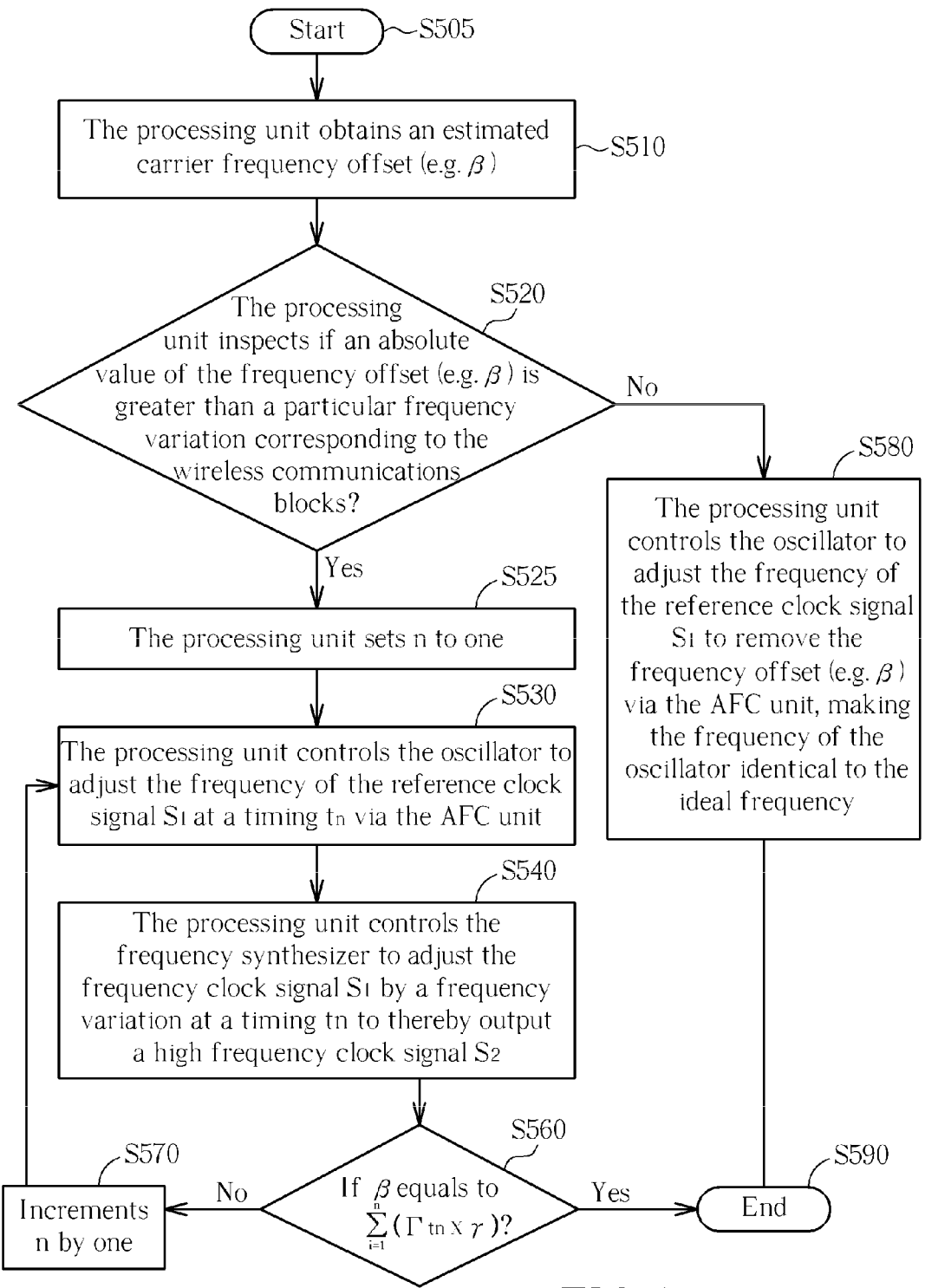
FIG. 5 is a flow chart of a first exemplary embodiment of a frequency adjusting method of the present invention.

Please refer to FIG. 5 in conjunction with FIG. 3 and FIG. 4B. FIG. 5 is an exemplary embodiment of a flowchart of a frequency adjusting method with reference to an exemplary embodiment of the electronic device 200 in FIG. 3. Please note that if the result is substantially the same, the steps are not limited to be executed according to the exact order shown in FIG. 5. The flow includes the following steps:

S505: Start.

S510: The processing unit 216 disposed in the wireless communications block 210 obtains an estimated carrier frequency offset (e.g. $\beta$) between a frequency of a high frequency clock signal $S_2$ (e.g. the LO signal) and a frequency of a BS carrier. In one embodiment, the high frequency clock signal $S_2$ is outputted from the frequency synthesizer 213, and the frequency synthesizer includes a PLL circuit.

S520: The processing unit 216 inspects if an absolute value of the frequency offset (e.g. $\beta$) is greater than a particular frequency variation (e.g. $\alpha\times\epsilon$) corresponding to the wireless communications blocks 220-250. For example, if the minimum of maximum frequency shifts/frequency variations that the wireless communications blocks 220-250 can tolerate is denoted as $\alpha$ Hz/sec, and a time unit for controlling the AFC unit 215 and the frequency synthesizer 213 is denoted as $\epsilon$ sec, then a maximum frequency variation that the AFC unit 215 controls the oscillator 260 to adjust the reference clock signal $S_1$ is $\alpha\times\epsilon$ Hz. When the wireless communications block 310 is a GSM module, the time unit $\epsilon$ between each two control steps may be set to 4.615 ms. If yes, go to step S525; otherwise, go to step S580.

S525: The processing unit 216 sets n to one.

S530: The processing unit 216, if required, controls the oscillator 260 to adjust the frequency of the reference clock signal $S_1$ at a timing $t_n$ via the AFC unit 215. For example, through setting an AFC DAC value of the AFC unit 215 the processing unit 216 can adjust the frequency of the reference clock signal $S_1$ outputted from the oscillator 260. In the exemplary case in FIG. 4A or 4B, the frequency variation adjusted by the processing unit 216 at the timing $t_n$ is denoted as $\Gamma_{tn} \times \gamma$. If the minimum of maximum acceptable frequency variations of the wireless communications blocks 220-250 is $\alpha$ Hz/sec, and the time unit for controlling the AFC unit 215 and the frequency synthesizer 213 is $\epsilon$ seconds (which is usually around 4-5 micro seconds), a maximum magnitude of a frequency variation adjusted by the processing unit 216 at the timing $t_n$ is $\alpha \times \epsilon$. That is, the adjusting magnitude does not exceed $\alpha \times \epsilon$.

S540: The processing unit 216 controls the frequency synthesizer 213 to adjust (i.e. compensates) the frequency clock signal $S_1$ by a frequency variation at a timing $t_n$. For example, the frequency synthesizer 213 may include a PLL circuit (not shown), and the frequency synthesizer 213 adjusts the frequency of the frequency clock signal $S_1$ by changing a PLL divider-N factor. In the exemplary case in FIG. 4A or FIG. 4B, the magnitudes compensated by the processing unit 216 at the timing $t_n$ is denoted as $\Delta_{tn}$. The compensated magnitudes is $$\Delta_{tn} = \left(\beta - \sum_{i=1}^{n}(\Gamma_{ti} \times \gamma)\right) \bigg/ \delta ..$$

S560: The processing unit 216 inspects if $\beta$ equals $$\sum_{i=1}^{n}(\Gamma_{ti} \times \gamma).$$

If yes, go to step S590; otherwise, go to step S570.

S570: The processing unit 216 increments n by one. Then, goes to step S530.

S580: The processing unit 216 controls the oscillator 260 to adjust the frequency of the reference clock signal $S_1$ to remove the frequency offset (e.g. $\beta$) via the AFC unit 215, making the frequency of the oscillator 260 identical to the ideal frequency. For example, the oscillator 260 will output the reference clock signal $S_1$ at 26 MHz after the adjusting operation.

S590: End.

Figure 6:
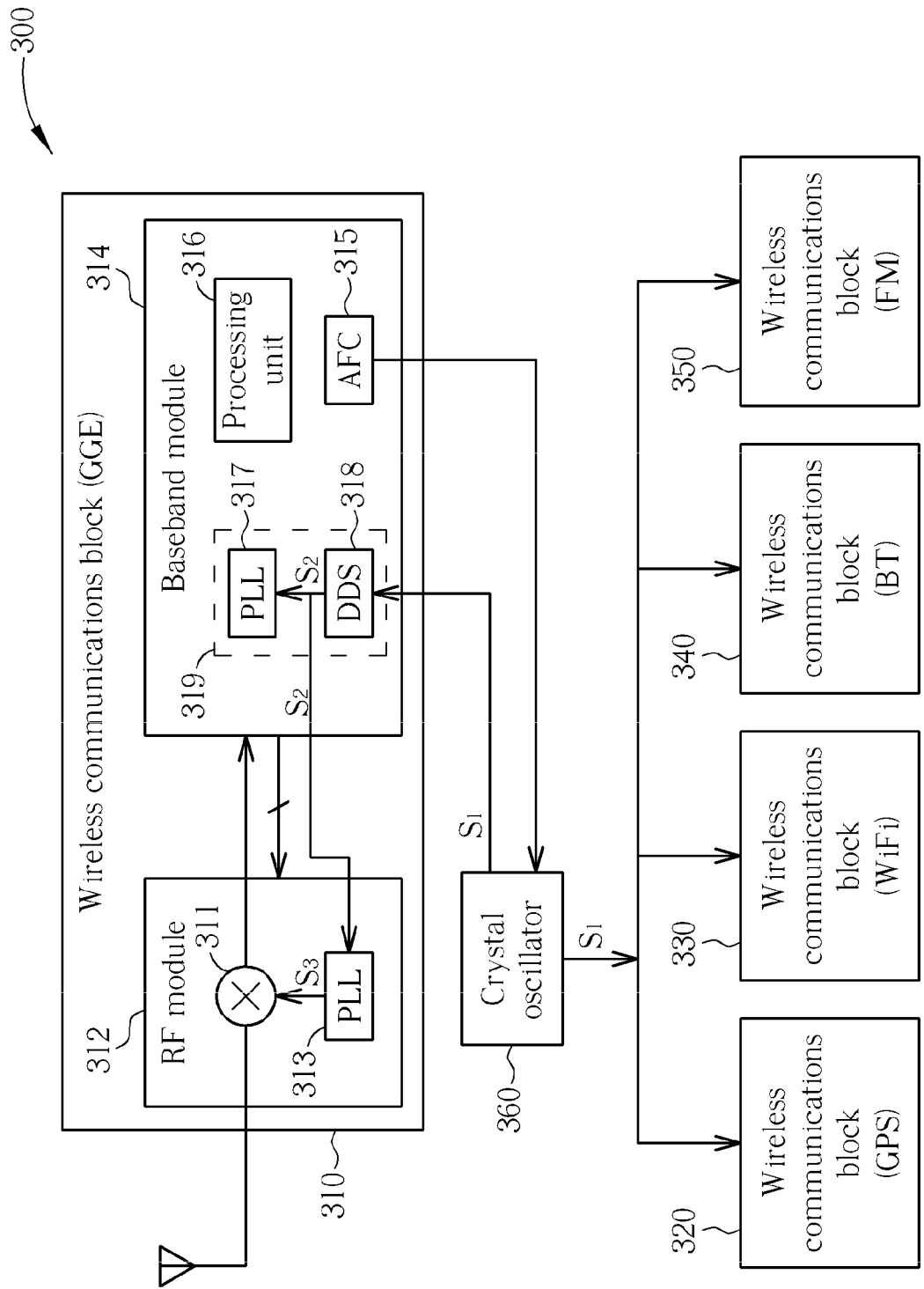
FIG. 6 is a diagram illustrating operational details of the electronic apparatus in FIG. 2 according to a second exemplary embodiment of the present invention.

Please refer to FIG. 6 in conjunction with FIG. 2. FIG. 6 is a diagram illustrating operational details of the electronic apparatus 100 in FIG. 2 according to a second exemplary embodiment of the present invention. A crystal oscillator 360 is shared by a plurality of wireless communications blocks 310, 320, 330, 340, and 350 for providing a reference clock signal $S_1$ to the baseband module 314 and providing the clock signal $S_1'$ to the wireless communications blocks 320-350. Please note that in this exemplary embodiment, the baseband module 314 is equipped with a Direct Digital Synthesizer (DDS) 318, and the DDS synthesizer 318 is coupled to the oscillator 360 for receiving the reference clock signal $S_1$ and adjusting the frequency of the reference clock signal $S_1$ according to an estimated frequency offset between the RF module 312 and a corresponding BS and outputting a second clock signal $S_2$, the frequency of the second clock signal $S_2$ being identical to an ideal frequency of the oscillator 360, such as 26 MHz. The RF module 312 receives the clock signal $S_2$ and generates a high frequency clock signal (e.g. the Local Oscillating (LO) signal) $S_3$ having an RF carrier frequency. The mixer 311 multiplies the received RF signals with the high frequency clock signal $S_3$ having the RF carrier frequency, wherein the radio frequency may be, for example, 936 MHz for a GSM receiver module, or others, according to the design requirements. When the RF module 312 receives the wireless radio frequency (RF) signals from a broadcast node, the mixer 311 recovers the received signal as baseband signals by using the high frequency clock signal (e.g. the RF carrier) $S_3$, and the baseband module 314 converts the baseband signals to a plurality of digital signals and processes the digital signals.

In this embodiment, the wireless communications block 310 may be a GSM/GPRS/EGPRS (GGE) module complying with GGE standards, the wireless communications block 320 may be a GPS module complying with a GPS standard, the wireless communications block 330 may be a WiFi module complying with a WiFi standard, the wireless communications block 340 may be an FM module complying with an FM standard, and the wireless communications block 350 may be a Bluetooth module complying with a Bluetooth standard. However, the wireless communications block 310 may be a wireless communications block corresponding to CDMA technology in other exemplary embodiments of the present invention. Types of the wireless communications blocks 320-350 are not meant to be a limitation of the present invention, and all alternative designs thereof fall within the scope of the present invention.

For guaranteeing the demodulation quality of the wireless communications block 310 (e.g. the GGE module) with consideration given to the frequency tolerance of the frequency variations per step for each of the wireless communications blocks 320-350, a baseband module 314 within the wireless communications block 310 ensures the precision of RF carriers of the wireless communications block 310 by removing the frequency offset of the high frequency clock signal $S_1$ via the DDS 318, and the processing unit 316 may further control the AFC unit 215 to adjust the output frequency of the reference clock signal $S_1$ gradually.

As mentioned above, the wireless communications block 310 (e.g. the GGE block) executes the frequency tracking operation for making the frequency of the high frequency clock signal (e.g. the RF carrier) $S_3$ identical to that of a BS carrier. However, to avoid degrade the performance of the wireless communications blocks 320-350, the processing unit 316 may adjust the output frequency of the oscillator 360 to a precise frequency gradually via the AFC unit 315 disposed in the baseband module 314 with the aid of the DDS 318.

When the wireless communications block 310 may be a GSM module, a GPRS module, or/and an EGPRS module, and the detected frequency offset between the RF module 312 and the corresponding BS station is larger than the minimum of maximum acceptable frequency variations of the wireless communications blocks 320-350, the wireless communications block 310 may control the DDS 318 and the AFC unit 315 to adjust the clock signal $S_2$ and the reference clock signal $S_1$ to make a frequency of the high frequency clock signal $S_3$ (e.g. LO signal) the same as that of a corresponding BS carrier. The PLL 317 is coupled to the DDS 318, and generates a clock signal according to the clock signal $S_2$. Note that the DDS 318 and the PLL 317 disposed in the BB module 314 can be viewed as a two-step synthesizer 319.

Suppose that the minimum of maximum acceptable frequency variations of the wireless communications blocks 320-350 is $\alpha$ Hz/sec, and the time unit for controlling the AFC unit 315 and the DDS 318 is $\epsilon$ seconds (which may be around 4-5 micro seconds). For example, when the wireless communications block 310 is a GSM module, the time unit $\epsilon$ is 4.615 ms, equal to a duration of a frame. The AFC unit 315 and the DDS 318 are stepwise controlled. Suppose that adjusting the AFC unit 315 by one magnitude increases or decreases γ Hz for the reference clock signal $S_1$, and adjusting the DDS 318 by one magnitude increases or decreases δ Hz for the clock signal $S_2$. At a frame j, the total magnitudes for adjusting the DDS 318 is $\Delta_j$, and the total magnitudes for adjusting the AFC unit 315 is $\Gamma_j$ by control of the wireless communications block 310, and, at the previous frame j–1, the total magnitudes for adjusting the DDS 318 is $\Delta_{j-1}$ and total magnitudes for adjusting the AFC unit 315 is $\Gamma_{j-1}$. A total frequency variation $\omega_j$ of the RF carrier frequency at a frame j is present as the aforementioned formula (1):

$$\omega_j = (\Gamma_j - \Gamma_{j-1})*\gamma + (\Delta_j - \Delta_{j-1})*\delta.$$

Since the scenarios of the adjustments of the frequency offset are similar to the disclosed descriptions of equations (2-1)-(6-2), description of using the DDS 318 to do the frequency adjustments is omitted for the sake of brevity. In this way, the frequency of the oscillator 360 is precisely at an ideal frequency, such as 26 MHz, when the frequency adjusting process is finished. In this way, the total frequency offset of the high frequency clock signal is removed by gradually adjusting to the crystal oscillator 360 with compensations via the DDS 318, avoiding the mentioned frequency jump happened to the crystal oscillator 360.

Figure 7:
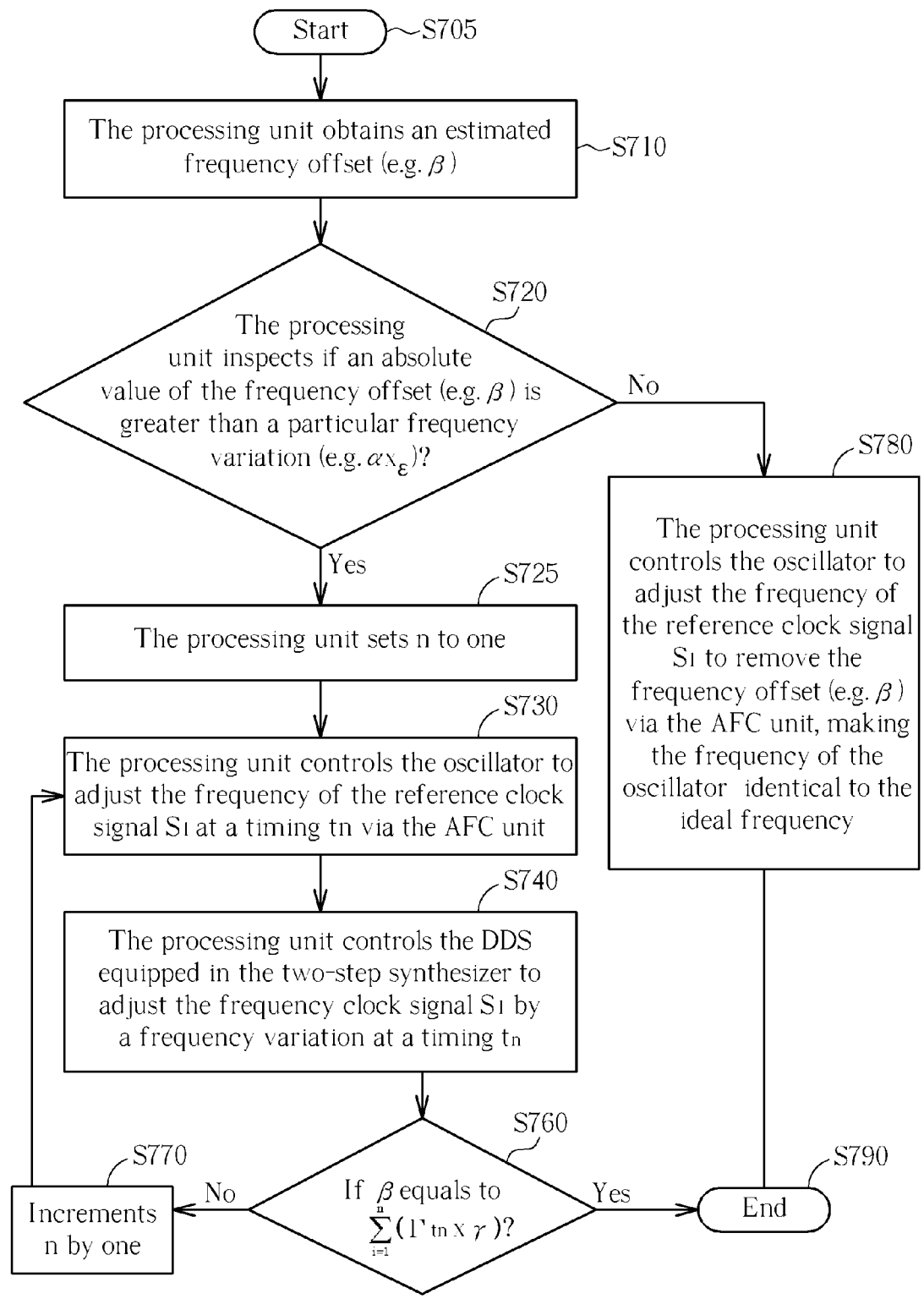
FIG. 7 is a flow chart of a second exemplary embodiment of a frequency adjusting method of the present invention.

Please refer to FIG. 7 in conjunction with FIG. 6. FIG. 7 is an exemplary embodiment of the flow chart of a frequency adjusting method with reference to an exemplary embodiment of the electronic device 300 in FIG. 6. Please note that if the result is substantially the same, the steps are not limited to be executed according to the exact order shown in FIG. 7. The flow includes the following steps:

S705: Start.

S710: The processing unit 316 disposed in the wireless communications block 310 obtains an estimated carrier frequency offset (e.g. β) between a frequency of a high frequency clock signal $S_3$ (e.g. the LO signal) and a frequency of a BS carrier. In one embodiment, the high frequency clock signal $S_3$ is outputted from the PLL 313 of the RF module 312, and the frequency adjusting operations are operated by a DDS 318 within a two-step synthesizer 319 and by the AFC unit 315. The two-step synthesizer 319 includes a PLL circuit 317.

S720: The processing unit 316 inspects if an absolute value of the frequency offset (e.g. β) is greater than a particular frequency variation (e.g. α×ϵ) corresponding to the wireless communications blocks 320-350 or not. For example, if the minimum of maximum frequency shifts/frequency variations that the wireless communications blocks 320-350 can tolerate is denoted as α Hz/sec, and a time unit for controlling the AFC unit 315 and the DDS 318 of the two-step synthesizer 319 is denoted as ϵ seconds, then a maximum frequency variation that the AFC unit 315 controls the oscillator 360 to adjust the reference clock signals $S_1$ is α×ϵ Hz. When the wireless communications block 310 is a GSM module, the time unit ϵ between each two control steps may be set to 4.615 ms. If yes, go to step S725; otherwise, go to step S780.

S725: The processing unit 316 sets n to one.

S730: The processing unit 316, if required, controls the oscillator 360 to adjust the frequency of the reference clock signal $S_1$ at a timing $t_n$ via the AFC unit 315. For example, through setting an AFC DAC value of the AFC unit 315 the processing unit 316 can adjust the frequency of the reference clock signal $S_1$ outputted from the oscillator 360. In the exemplary case in FIG. 4A or FIG. 4B, the frequency variation adjusted by the processing unit 316 at the timing $t_n$ is denoted as $\Gamma_m \times \gamma$. If the minimum of maximum acceptable frequency variations of the wireless communications blocks 320-350 is α Hz/sec, and the time unit for controlling the AFC unit 315 and the DSS 318 is ϵ seconds (which is usually around 4-5 micro seconds), a maximum magnitude of a frequency variation adjusted by the processing unit 316 at the timing $t_n$ is α×ϵ. That is, the adjusting magnitude is not greater than α×ϵ.

S740: The processing unit 316 controls the DDS 318 equipped in the two-step synthesizer 319 to adjust (i.e. compensate) the frequency clock signal $S_1$ by a frequency variation at a timing $t_n$. In the exemplary case in FIG. 4A or FIG. 4B, the frequency variation compensated by the processing unit 216 at the timing $t_n$ is denoted as $\Delta_m$. The compensated magnitudes is $$\Delta_m = \left(\beta - \sum_{i=1}^{n}(\Gamma_m \times \gamma)\right)/\delta.$$

S760: The processing unit 316 inspects if β equals $$\sum_{i=1}^{n}(\Gamma_m \times \gamma).$$

If yes, go to step S790; otherwise, go to step S770.

S770: The processing unit 316 increments n by one. Then, goes back to step S530.

S780: The processing unit 316 controls the oscillator 360 to adjust the frequency of the reference clock signal $S_1$ to remove the frequency offset (e.g. β) via the AFC unit 316, making the frequency of the oscillator 360 identical to the ideal frequency. For example, the oscillator 360 outputs the reference clock signals $S_1$ at 26 MHz after the adjusting operation.

S790: End.

Please note that in the aforementioned embodiments the AFC unit is disposed in the baseband module. However, according to different design requirements, the AFC unit for adjusting the frequency output from the shared precise oscillator may be disposed in the RF module. In addition, the electronic apparatus 300 may use other circuits to replace the DDS 318. All alternative designs following the spirit of the above disclosure fall within the scope of the present invention.

Note that the frequency synthesizer 213 disposed in the RF module 212 (FIG. 3) or the DDS 318 disposed in the Baseband module 314 is operated as a compensation unit. The compensation unit compensates a frequency of a reference clock signal outputted from the shared oscillator 260 or 360 to ensure that a frequency of the high frequency clock signal coupled to the mixer 211 or 311 is identical to a frequency of a BS carrier for accurate demodulation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus, comprising:
   a processing unit, when detecting a frequency offset between an radio frequency (RF) module and a corresponding base station (BS), controlling an oscillator to change a frequency of a first reference clock signal outputted therefrom by a first frequency variation, and controlling a compensation unit to change a frequency of a second reference clock signal outputted therefrom by a second frequency variation, wherein the compensation unit receives and adjusts the first reference clock signal from the oscillator to output the second reference clock signal, and the frequency offset substantially equals the first frequency variation plus the second frequency variation.

2. The electronic apparatus of claim 1, wherein the changed second reference clock signal is output to a mixer of the RF module and is identical to a frequency of a BS carrier broadcasted by the corresponding BS.

3. The electronic apparatus of claim 1, wherein the control to the oscillator and the compensation unit is stepwise.

4. The electronic apparatus of claim 3, wherein the processing unit is disposed in a first wireless communications block, the oscillator is shared by the first wireless communications block and a second wireless communications block, and the first and second wireless communications blocks comply with different wireless communications standards.

5. The electronic apparatus of claim 4, wherein, for each step of controlling the oscillator and the compensation unit, the first frequency variation does not exceed a maximum acceptable frequency variation for the second wireless communications block.

6. The electronic apparatus of claim 3, wherein an interval between each two steps falls within a range delimited by 4 ms and 5 ms.

7. The electronic apparatus of claim 2, wherein the processing unit is disposed in a Baseband module, the processing unit controls the oscillator by setting an automatic frequency control (AFC) digital to analog conversion (DAC) value to change the frequency of the first reference clock signal.

8. The electronic apparatus of claim 7, wherein the compensation unit is a frequency synthesizer disposed in the RF module, and the frequency synthesizer is coupled between the mixer and the oscillator.

9. The electronic apparatus of claim 7, wherein the compensation unit is a two-step synthesizer disposed in the baseband module.

10. The electronic apparatus of claim 9, wherein the two-step synthesizer comprises a Direct Digital Synthesizer (DDS) coupled between the mixer and the oscillator.

11. A frequency adjusting method, comprising:
when detecting a frequency offset between an radio frequency (RF) module and a corresponding base station (BS), controlling, by a processing unit, an oscillator to change a frequency of a first reference clock signal outputted therefrom by a first frequency variation, and controlling, by the processing unit, a compensation unit to change a frequency of a second reference clock signal outputted therefrom by a second frequency variation,
wherein the compensation unit receives and adjusts the first reference clock signal from the oscillator to output the second reference clock signal, and the frequency offset substantially equals the first frequency variation plus the second frequency variation.

12. The method of claim 11, wherein control to the oscillator and the compensation unit is stepwise, and an interval between each two steps falls within a range delimited by 4 ms and 5 ms.

13. The method of claim 11, wherein the processing unit is disposed in a first wireless communications block, the oscillator is shared by the first wireless communications block and a second wireless communications block, and the first and second wireless communications blocks comply with different wireless communications standards.

14. The method of claim 13, wherein the detected frequency offset is greater than $\alpha \times \epsilon$, and step for controlling to the oscillator and the compensation unit comprises a plurality of sub-steps, and for each sub-step, the absolute of newly added first frequency variation in current is $\alpha \times \epsilon$ or less, $\alpha$ represents a maximum acceptable frequency variation for the second wireless communications block in Hz per sec, and $\epsilon$ represents a time unit for controlling the oscillator and the compensation unit in micro seconds.

15. The method of claim 14, wherein the oscillator and the compensation unit are controlled sub-step by sub-step until the frequency offset equals a summation of all first frequency variations adjusted in the sub-steps.

16. The method of claim 15, wherein, in the beginning sub-step, the first frequency variation is set to $\alpha \times \epsilon$, $\alpha$ represents a maximum acceptable frequency variation for the second wireless communications block in Hz per sec, and $\epsilon$ represents a time unit for controlling the oscillator and the compensation unit in micro seconds, and the second frequency variation is set by subtracting the first frequency variation from the frequency offset.

17. The method of claim 16, wherein, in each of the subsequent second to n sub-steps, the first frequency variation is set to a summation of all first frequency variations adjusted in previous sub-steps plus a new frequency variation being equal to or not greater than $\alpha \times \epsilon$, and the second frequency variation is set to the inverse of the new frequency variation.

18. The method of claim 11, wherein the oscillator is controlled by setting an automatic frequency control digital-to-analog converter (AFC DAC) value corresponding to the first frequency variation.

19. The method of claim 11, wherein the compensation unit is a frequency synthesizer comprising a phase lock loop (PLL) circuit and the frequency synthesizer is controlled by changing a PLL divider-N factor corresponding to the second frequency variation.

* * * * *